(12) United States Patent
Tsai et al.

(10) Patent No.: US 8,207,523 B2
(45) Date of Patent: Jun. 26, 2012

(54) METAL OXIDE SEMICONDUCTOR FIELD EFFECT TRANSISTOR WITH STRAINED SOURCE/DRAIN EXTENSION LAYER

(75) Inventors: Chen-Hua Tsai, Hsinchu County (TW); Bang-Chiang Lan, Taipei (TW); Yu-Hsin Lin, Tainan (TW); Yi-Cheng Liu, Hsinchu County (TW); Cheng-Tzung Tsai, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 591 days.

(21) Appl. No.: 11/308,718

(22) Filed: Apr. 26, 2006

(65) Prior Publication Data
US 2007/0254421 A1   Nov. 1, 2007

(51) Int. Cl.
*H01L 29/06* (2006.01)
*H01L 31/00* (2006.01)

(52) U.S. Cl. ............ 257/19; 257/18; 257/616; 257/192; 438/933; 438/300; 438/931; 438/938

(58) Field of Classification Search .................. 257/616, 257/368, 617, E29.193, 288, 369, 341, 350, 257/18, 19, E29.297, 192, 213, 382; 438/231, 438/305, 938, 933, 753, 931, FOR. 487, FOR. 292, 438/285, 590, 197, 300
See application file for complete search history.

(56) References Cited

U.S. PATENT DOCUMENTS

| | | | |
|---|---|---|---|
| 5,710,450 A | 1/1998 | Chau et al. | 257/344 |
| 6,165,826 A | 12/2000 | Chau et al. | 438/231 |
| 6,573,534 B1 * | 6/2003 | Kumar et al. | 257/77 |
| 6,621,131 B2 | 9/2003 | Murthy et al. | 257/408 |
| 6,812,103 B2 | 11/2004 | Wang et al. | |
| 6,887,762 B1 | 5/2005 | Murthy et al. | 438/300 |
| 6,949,482 B2 | 9/2005 | Murthy et al. | 438/739 |
| 7,436,046 B2 * | 10/2008 | Kondo et al. | 257/616 |
| 2006/0073664 A1 * | 4/2006 | Kondo et al. | 438/301 |
| 2006/0202278 A1 * | 9/2006 | Shima et al. | 257/369 |
| 2007/0001162 A1 * | 1/2007 | Orlowski et al. | 257/19 |

* cited by examiner

*Primary Examiner* — Ha Tran T Nguyen
*Assistant Examiner* — Thanh Y Tran
(74) *Attorney, Agent, or Firm* — WPAT., P.C.; Justin King

(57) ABSTRACT

A method of fabrication of a metal oxide semiconductor field effect transistor is disclosed. At first, a substrate on which a gate structure is formed is provided. Afterward, a portion of the substrate is removed to form a first recess in the substrate at both ends of the gate structure. Additionally, a source/drain extension layer is deposited in the first recess and a plurality of spacers are formed at both ends of the gate structure. Subsequently, a portion of the source/drain extension and the substrate are removed to form a second recess in the source/drain extension and a portion of the substrate outside of the spacer. In addition, a source/drain layer is deposited in the second recess. Because the source/drain extension and the source/drain layer have specific materials and structures, short channel effect is improved and the efficiency of the metal oxide semiconductor field effect transistor is improved.

21 Claims, 8 Drawing Sheets

METAL OXIDE SEMICONDUCTOR FIELD EFFECT TRANSISTOR WITH STRAINED SOURCE/DRAIN EXTENSION LAYER

BACKGROUND OF THE INVENTION

1. Field of Invention

The present invention is related to a semiconductor device and its method of fabrication, especially is related to a method of fabrication of a metal oxide semiconductor field effect transistor having strained layer.

2. Description of Related Art

The semiconductor industry and wafer fabrication is headed towards higher efficiency and ultra large-scale integration. For the sake of accomplishing higher effectiveness using the same amount of footprint area, the wafer characteristic dimensions and supply voltage will continue to diminish. Generally speaking, if other characteristics are held constant, the power consumption of each device will increase according to the on/off frequency. Therefore, although the supply voltage and the capacitance load is decreased, the power consumption of the wafer is gradually increasing. Furthermore, when the dimensions of the field effect transistor have become smaller, the commonly known short channel effect will become more pronounced, thus contributing to the severity of the power consumption issue.

The method for improving short channel effect includes the disposition of the source and the shallow source/drain extensions. Using fabrication of the metal oxide semiconductor field effect transistor as an example, an implantation of ions is performed within an elongated region of high dosage first through a mask after the gate is established, and at the two side walls of the channel to form shallow extensions. Later, a spacer is formed at the side wall of the gate, and a source/drain layer is formed in the substrate outside of the spacer. Followed by an annealing procedure is later performed. Annealing to activate the doping ion is then performed, and the shallow extending internally dopant is allowed to diffuse towards the channel region. Although the dopant diffused towards the channel region can improve, for example, punch through and other issues, the dopant diffusion rate is difficult to control, and excessive dopant will damage the transistor efficiency.

Furthermore, for improving further on the short channel effect, conventional technology is using halo implant to inhibit the so-called punch through effect. However, the ion for the halo implant will decrease the drain current, and based on the fact of continuous gate dimensional shrinkage, this issue will become more pronounced, thus disallowing the transistor efficiency to further improve.

SUMMARY OF THE INVENTION

The objective of the present invention is to provide a method of fabrication of metal oxide semiconductor field effect transistor, for improving the issue of the excessive spreading of shallow extending dopant internally towards the channel region.

Another objective of the present invention is to provide a metal oxide semiconductor field effect transistor, for raising the drain current.

To achieve the aforementioned or other objectives, the present invention proposes a method of fabrication of a metal oxide semiconductor field effect transistor. This method is to first provide a substrate, and a gate structure already formed on the substrate. Later, portions of the substrate are removed on the two side walls of the gate structure for forming a first recess. Later, the source/drain extension layer is deposited inside the first recess, and the spacers are formed on two side walls of the gate structure. Later, portions of the source/drain extension layer and the substrate on the outside of the spacer are removed to form a second recess using the source/drain extension layer. Furthermore, a source/drain layer is deposited inside the second recess.

To achieve the aforementioned or other objectives, the present invention further proposes a metal oxide semiconductor field effect transistor. The aforementioned metal oxide semiconductor field effect transistor includes a substrate, a spacer, a source/drain extension layer, and a source/drain layer. In which, a gate structure is disposed on the substrate, and the spacers are disposed on the side walls of the gate structure. The source/drain extension layer is disposed in the substrate below the spacer, and the source/drain layer is disposed in the substrate outside of the spacer. Furthermore, the depth of the source/drain layer is greater than the depth of the source/drain extension layer. The source/drain extension layer and the source/drain layer are both strained layers.

In an embodiment of the present invention, the structure of the aforementioned source/drain extension layer is, for example, epitaxy, and the method of fabrication of the source/drain extension layer is, for example, selective epitaxial deposition.

In an embodiment of the present invention, the structure of the aforementioned source/drain layer is, for example, epitaxy, and the method of fabrication of the source/drain layer is, for example, selective epitaxial deposition.

In an embodiment of the present invention, the material of the aforementioned source/drain extension layer is, for example, silicon germanium alloy, SiGe. Furthermore, the germanium composition ratio of a portion of the source/drain extension layer disposed adjacent to the substrate could be larger than of the portion of the source/drain extension layer which is at a farther distance to the substrate, and the germanium composition ratio of the source/drain extension layer is, for example, of gradient distribution.

In an embodiment of the present invention, a layer of the dopant diffusion barrier layer formed inside the first recess before the forming of the source/drain extension layer is further included. The material of the dopant diffusion barrier layer is, for example, silicon germanium. Furthermore, the dopant diffusion barrier layer, for example, includes N-type dopant.

In an embodiment of the present invention, the aforementioned source/drain extension layer is, for example, including P-type dopant. This P-type dopant is to perform in-situ doping injection, for example, during the forming of the source/drain extension layer. Furthermore, the P-type dopant is, for example, boron ion.

In an embodiment of the present invention, the material of the aforementioned source/drain layer is, for example, silicon germanium. Furthermore, the source/drain layer, for example, includes P-type dopant. The P-type dopant, for example, is boron ion. Furthermore, the P-type dopant, for example, is to perform in-situ doping injection during the forming of the source/drain layer.

In an embodiment of the present invention, the material of the aforementioned source/drain extension layer, for example, is silicon carbide alloy, SiC. Furthermore, the carbon composition ratio of the portion of the source/drain extension layer adjacent to the substrate exceeds that of the carbon composition ratio of the portion of the source/drain extension layer disposed at a farther distance to the substrate. Furthermore, the carbon composition ratio of the source/drain extension layer is, for example, of gradient distribution.

In addition, prior to the forming of the source/drain extension layer, a layer of dopant diffusion barrier layer formed inside the first recess is further included. The material of the dopant diffusion barrier layer, for example, is silicon carbide. Furthermore, the dopant diffusion barrier layer, for example, includes P-type dopant.

In an embodiment of the present invention, the aforementioned source/drain extension layer, for example, includes N-type dopant. N-type dopant, for example, is to perform in-situ doping injection during the forming of the source/drain extension layer. Furthermore, N-type dopant, for example, is phosphorous ion or arsenic ion.

In an embodiment of the present invention, the material of the aforementioned source/drain layer, for example, is silicon carbide. The source/drain layer, for example, includes N-type dopant. Furthermore, this N-type dopant, for example, is to perform in-situ doping injection during the forming of the source/drain layer. Furthermore, the N-type dopant, for example, is phosphorous ion or arsenic ion.

In an embodiment of the present invention, the aforementioned metal oxide semiconductor field effect transistor further includes a layer of dopant diffusion barrier layer, disposed in between the source/drain extension layer and the substrate. The material of the dopant diffusion barrier layer, for example, is silicon germanium. Furthermore, the dopant diffusion barrier layer, for example, includes N-type dopant.

In an embodiment of the present invention, the aforementioned metal oxide semiconductor field effect transistor further includes a layer of dopant diffusion barrier layer, disposed in between the source/drain extension layer and the substrate. The material of the dopant diffusion barrier layer, for example, is silicon carbide. Furthermore, the dopant diffusion barrier layer, for example, includes P-type dopant.

In an embodiment of the present invention, the aforementioned substrate is, for example, silicon based substrate, pure silicon substrate, silicon on insulator (SOI) substrate, germanium channel substrate, substrate having bulk strain, and substrate having crystallographic orientation.

Because the method of fabrication of the metal oxide semiconductor field effect transistor of the present invention is before the forming of the source/drain extension layer, a layer of dopant diffusion barrier layer, therefore, is first formed after the forming of the source/drain extension layer, thus blocking doping due to activation of annealing to have diffusion towards the channel region. Furthermore, because the germanium composition ratio or the carbon composition ratio of the portion of the source/drain extension layer disposed adjacent to the substrate are, for example, larger than the germanium composition ratio or the carbon composition ratio disposed at the portion of the source/drain extension layer at a farther distance to the substrate, therefore, dopant, as a result of activation annealing, can thus have controlled diffusion rate of the channel region. Because the diffusion rate of the dopant towards the channel region is to achieve superior control, therefore, manufacturing allowance can be increased. Another further aspect is that because the source/drain extension layer and the source/drain layer of the metal oxide semiconductor field effect transistor of the present invention are both strained layers, therefore, the source/drain extension layer and the source/drain layer will exert stress towards the channel region, thus increasing the saturation-region drain current and the linear-region drain current of the transistor. In addition, because the material of the source/drain extension layer and the source/drain layer are silicon germanium or silicon carbide, therefore, the efficiency of the metal oxide semiconductor field effect transistor can be increased.

To better understand the aforementioned advantages, characteristics, and functionalities, further aspects of the present invention, and further features and benefits thereof, are described below. The accompanying drawings, which are incorporated herein and form a part of the specification, illustrate the present invention and, together with the description, further server to explain the principles of the invention and to enable a person skilled in the pertinent art to make and use the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

First Embodiment

FIG. 1A to FIG. 1G are a plurality of cross-sectional views illustrating the fabrication process of the metal oxide semiconductor field effect transistor according to an embodiment of the present invention. In a first embodiment, the metal oxide semiconductor field effect transistor of the present invention is using a PMOS process as an illustrative example.

Figure 1A:
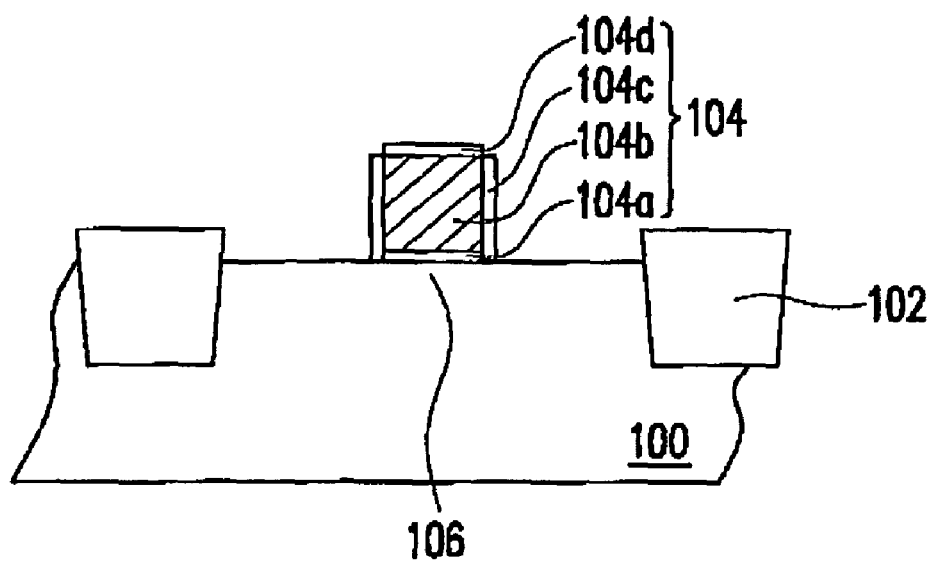
FIG. 1A to FIG. 1G are a plurality of cross-sectional views illustrating the fabrication process of a metal oxide semiconductor field effect transistor according to an embodiment of the present invention.

Referring to FIG. 1A, a substrate 100 is first provided, where the substrate 100, for example, is silicon-based substrate, pure silicon substrate, silicon on insulator (SOI) substrate, germanium channel substrate, substrate having bulk strain, and substrate having crystallographic orientation. A plurality of isolation structures 102 are formed on the substrate 100. The material of the isolation structure 102, for example, is silicon oxide. A gate structure 104 is formed on the substrate 100 in between the isolation structures 102. The gate structure 104 at least includes the gate dielectric layer 104a, the gate 104b, and the spacer 104c and the gate protection layer 104d. In which, the material of the gate dielectric layer 104a, for example, is silicon oxide, the material of the gate 104b, for example, is doped polysilicon, the material of the spacer 104c, for example, is silicon oxide, and the material of the gate protection layer 104d, for example, is silicon nitride or silicon oxide. Furthermore, the channel region 106 of the metal oxide semiconductor field effect transistoris is formed at the substrate 100 below the gate structure 104.

Figure 1B:
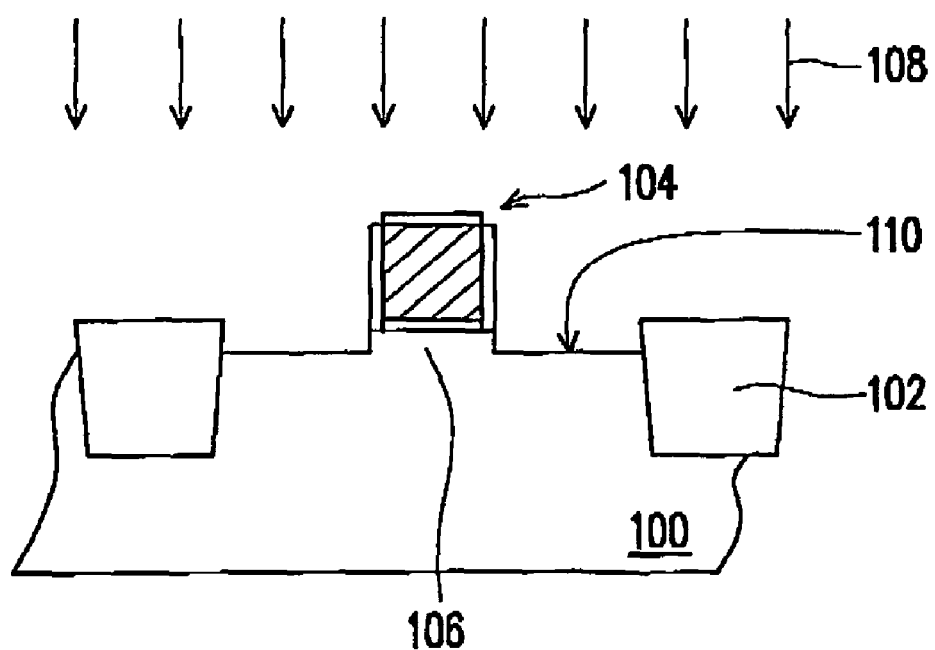

Later, referring to FIG. 1B, dry etching process 108 is performed, a portion of the substrate 100 is removed, and a recess 110 is formed at the two side walls of the gate structure 104 in the substrate 100. A dry etching process 108, for example, is reactive ion etching, RIE. The dry etching process 108 reaction gas, for example, is Hexafluroethane ($C_2F_6$) and helium.

Figure 1C:
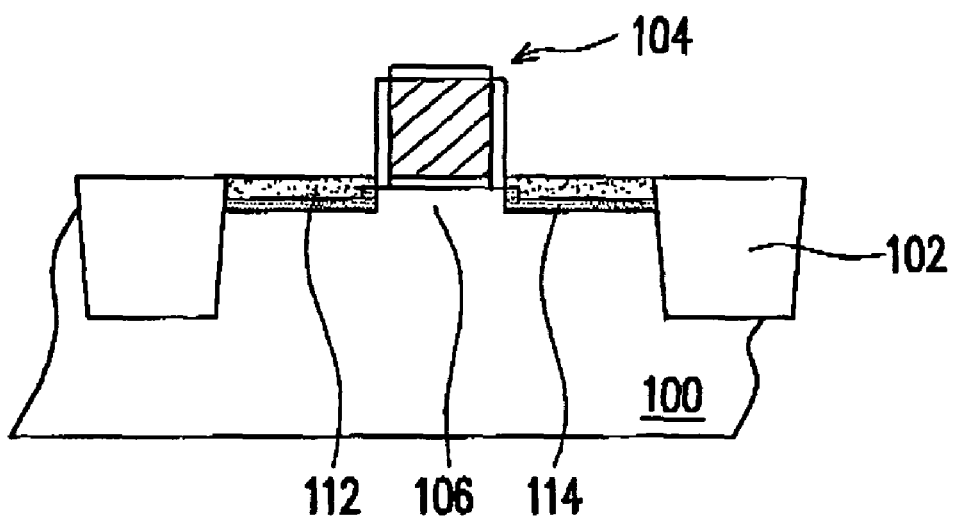

Later, referring to FIG. 1C, a source/drain extension layer 112 is formed inside the recess 110. The material of the source/drain extension layer 112, for example, is silicon germanium. The composite structure of the silicon germanium is typically represented by $Si_XGe_{1-X}$, or SiGe can be directly used for representation. In which, the range for x is between 0 to 1. Furthermore, the structure of the source/drain extension layer 112, for example, is epitaxy. The method of fabrication of the source/drain extension layer 112, for example, is selective epitaxial deposition, which allows silicon germanium to grow only on the silicon, and not on the silicon oxide or the silicon nitride. In other words, silicon germanium only grows on the recess 110, and not on the spacer 104c, the gate protection layer 104d, and the isolation structure 102. The selective epitaxial deposition, for example, is vapor phase epitaxy, which includes reduced pressure chemical vapor deposition epitaxial deposition, atmospheric pressure chemical vapor deposition epitaxy, and ultra high vacuum chemical vapor deposition epitaxy.

A point worth mentioning is that, because the lattice constant of germanium is larger than silicon, therefore, the source/drain extension layer 112 using the silicon germanium as material is a strained layer. In other words, the silicon germanium lattice of the source/drain extension layer 112, because of compression, is to produce anisotropic structure, thus changing the conduction band and the valence band. Because the source/drain extension layer 112 is bonded to the substrate 100, the conduction band and the valence band can be tailored to perform design discontinuously to produce quantum well and built-in electric field, therefore, the rate of penetration of the carrier of the interface between the source/drain extension layer 112 and the substrate 100 is allowed to be increased. In summary, the source/drain extension layer 112, by adopting silicon germanium as material, can improve the efficiency of the metal oxide semiconductor field effect transistor.

Furthermore, the source/drain extension layer 112, for example, includes P-type dopant. The P-type dopant, for example, is to perform in-situ doping injection and ex-situ doping during the forming of the source/drain extension layer 112. In comparison, in-situ doping can allow the source/drain extension layer 112 to have higher active dopant concentration. Furthermore, because the source/drain extension layer 112 is a strained layer which uses silicon germanium as material, therefore, the source/drain extension layer 112 will exert a stress on the channel region 106. This stress and the aforementioned highly-activated dopant concentration will increase the saturation-region drain current, (Idsat), and the linear-region drain current, (Idlin), of the transistor. Therefore, the P-type dopant can also, at after the forming of source/drain extension layer 112, perform ex-situ dopant injection. Furthermore, the P-type dopant, for example, is boron ion. One thing worth mentioning is that, after the forming of the source/drain extension layer 112, the procedure of doped activation annealing is typically performed, and the P-type dopant is allowed to diffuse towards the channel region 106 below the gate structure 104. For the sake of effectively controlling the diffusion rate of the P-type dopant in the present embodiment, prior to the forming of the source/drain extension layer 112, a layer of a dopant diffusion barrier layer 114 formed inside the recess 110 is further included, but the present invention is not only limited to this. The material of the dopant diffusion barrier layer 114, for example, is silicon germanium. Furthermore, the dopant diffusion barrier layer 114, for example, includes N-type dopant, for blocking excessive P-type dopant for diffusion towards the channel region 106. The method of fabrication of the dopant diffusion barrier layer 114, for example, is the aforementioned selective epitaxial deposition. Furthermore, in another embodiment, the germanium composition ratio of the portion of the source/drain extension layer 112 adjacent to the substrate 100, for example, is larger than the germanium composition ratio of the portion of the source/drain extension layer 112 disposed at a farther distance to the substrate 100. This type of design allows for the portion of the source/drain extension layer 112 closer to the channel region 106 to have more germanium atoms for blocking the excessive P-type dopant diffused towards the channel region 106. Furthermore, the germanium composition ratio of the source/drain extension layer 112, for example, is of gradient distribution. As can be seen, when the source/drain extension layer 112 is using P-type dopant, the germanium distribution of the source/drain extension layer 112 can be used for controlling the P-type dopant quantity diffused towards the channel region 106.

Figure 1D:
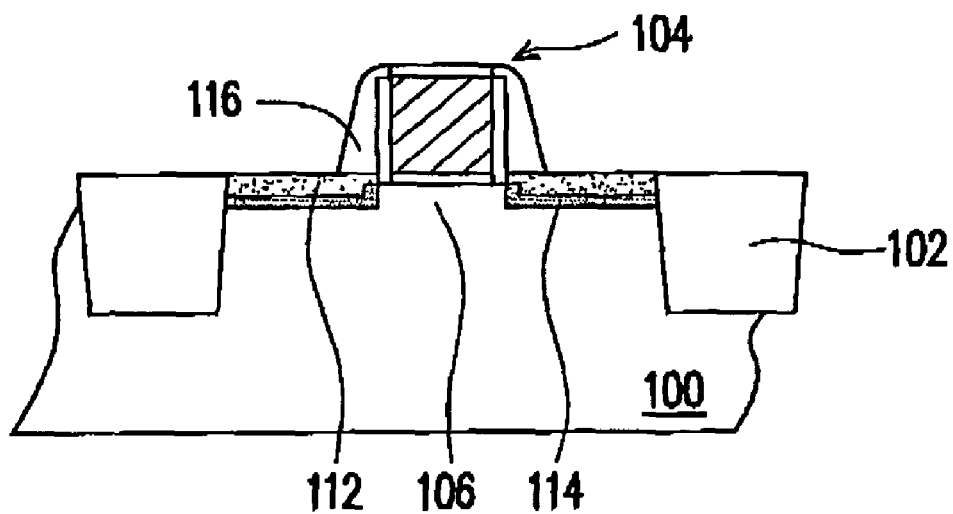

Later, referring to FIG. 1D, a spacer 116 is formed at the two side walls of the gate structure 104. The material of the spacer 116, for example, is silicon nitride, and the method of fabrication of the spacer 116 is a conventional technique used and known by those skilled in the art, therefore, no further details are required.

Figure 1E:
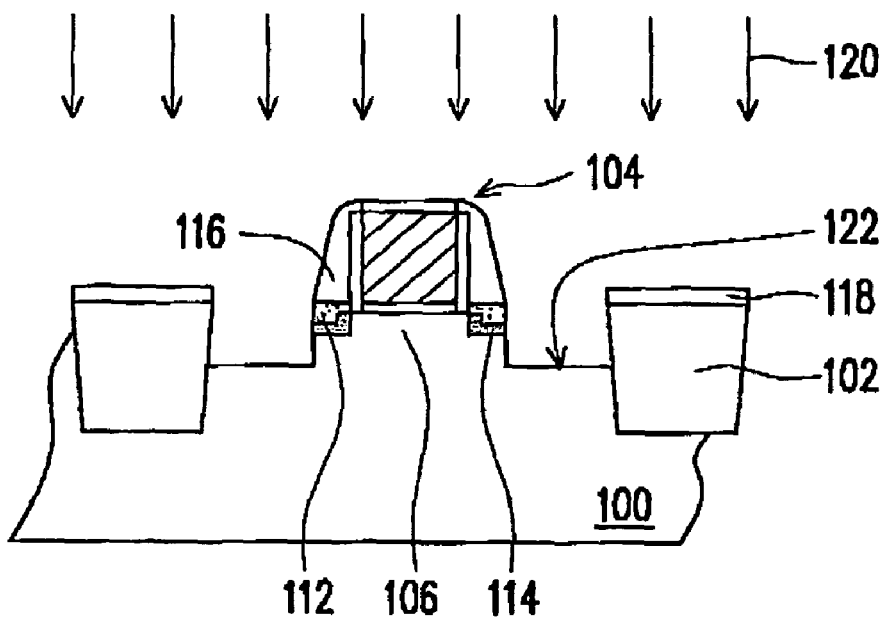

Later, referring to FIG. 1E, a layer of dielectric layer 118 is formed on the isolation structure 102. The material of the dielectric layer 118, for example, is silicon oxide or silicon nitride. The method of fabrication of the dielectric layer 118, for example, is to form a layer of dielectric layer over all of the structures illustrated in FIG. 1D, then to perform photolithography and etching to expose the spacer 116 and the source/drain extension layer 112, and then to forming it. Later, using the spacer 116 and the dielectric layer 118 as a mask, a dry etching process 120 is performed for removing portions of the source/drain extension layer 112 and portions of the substrate 100 to form a recess 122. Furthermore, because the metal oxide semiconductor field effect transistor of the present embodiment further includes the dopant diffusion barrier layer 114, therefore, the dry etching process 120 further includes the removal of a portion of the dopant diffusion barrier layer 114. In addition, reaction gas used in the dry etching process 120 during removal of silicon germanium is, for example, HBr, $SF_6$, and $Cl_2$.

Figure 1F:
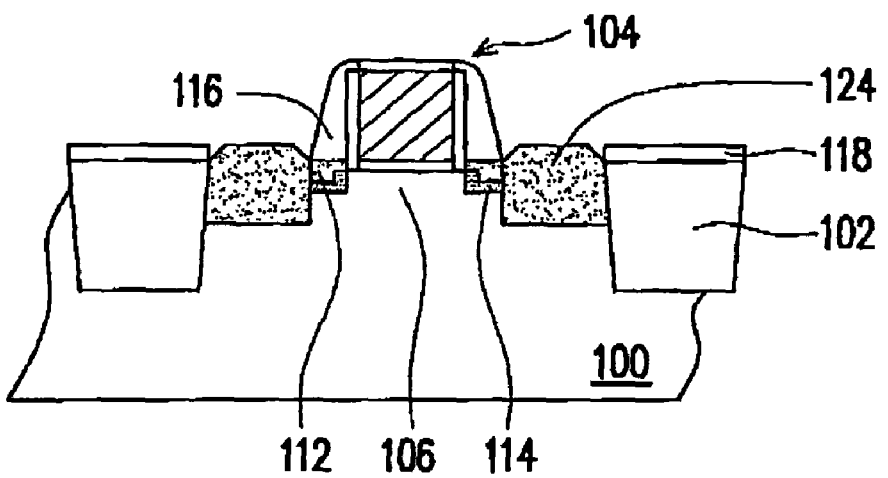

Later, referring to FIG. 1F, inside the recess 122, a source/drain layer 124 is deposited. The material of the source/drain layer 124, for example, is silicon germanium. And the struture of the source/drain layer 124, for example, is epitaxy. In addition, because the material of the source/drain layer 124 is silicon germanium, therefore, the source/drain layer 124 is a strained layer, thus can improve the efficiency of the metal oxide semiconductor field effect transistor. The method of fabrication of the source/drain layer 124, for example, is the aforementioned selective epitaxial deposition, for allowing silicon germanium to grow only on the silicon, and not to grow on silicon oxide or silicon nitride. In other words, silicon germanium will only grow on the recess 122, and will not grow on the gate protection layer 104d, the spacer 116 and the dielectric layer 118. Furthermore, the source/drain layer 124, for example, includes P-type dopant. For example, P-type dopant is to perform in-situ doping injection during the forming of the source/drain layer 124. In comparison with ex-situ doping, in-situ doping can make the source/drain layer 124 to have higher activation doping concentration. Furthermore, because the source/drain layer 124 is a strained layer, using silicon germanium as material, the source/drain layer 124 will therefore exert a stress on the channel region 106. This stress and the aforementioned high activation doping concentration will increase the saturation-region drain current and the linear-region drain current of the transistor. Indeed, after the forming of the source/drain layer 124, ex-situ doping injection can also be performed. Furthermore, the P-type dopant of the source/drain layer 124, for example, is boron ion.

Figure 1G:
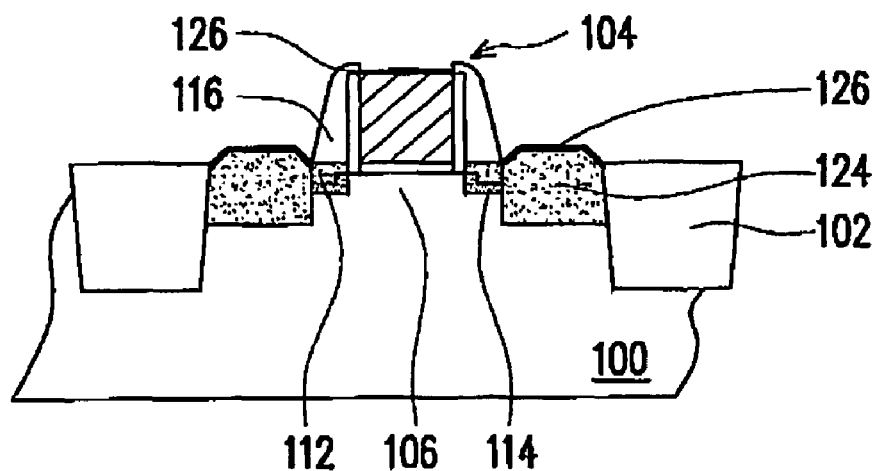

Later, referring to FIG. 1G, the gate protection layer 104*d* and the dielectric layer 118 is removed. The method for removal of the gate protection layer 104*d* and the dielectric layer 118, for example, is a wet etching process, and this wet etching process, for example, uses hot phosphoric acid or hydrofluoric acid as etchant. Later, a metal silicide layer 126 is formed on the gate 104*b* on the gate structure 102 and also on the source/drain layer 124, for decreasing the contact resistance between the subsequently formed contact and the source/drain layer 124 and the contact resistance between the contact and the gate 104*b*. The material of the metal silicide layer 126, for example, is Ni(SiGe). The method of fabrication of the metal silicide layer 126, for example, is first to deposit a layer of nickel, later a rapid thermal anneal, RTA, is performed. And the material and method of fabrication of the aforementioned metal silicide layer 126 is an embodiment, however, the present invention is not limited to this only. Later, subsequent procedures are performed to complete the fabrication of the metal oxide semiconductor field effect transistor.

Because a layer of dopant diffusion barrier layer is first formed prior to forming of the source/drain extension layer in the present invention, therefore, after the forming of the source/drain extension layer, the P-type dopant is blocked because of activation annealing when diffused towards the channel region. Furthermore, because the germanium composition ratio of the portion of the source/drain extension layer 112 adjacent to substrate 100, for example, is larger than the germanium composition ratio of the portion of the source/drain extension layer 112 disposed at a farther distance to the substrate 100, therefore, P-type dopant, because of activation annealing, can have controlled rate of diffusion towards the channel region. Because the diffusion rate of the P-type dopant has obtained superior control towards the channel region, therefore, the fabrication allowance is increased.

Second Embodiment

Figure 2:
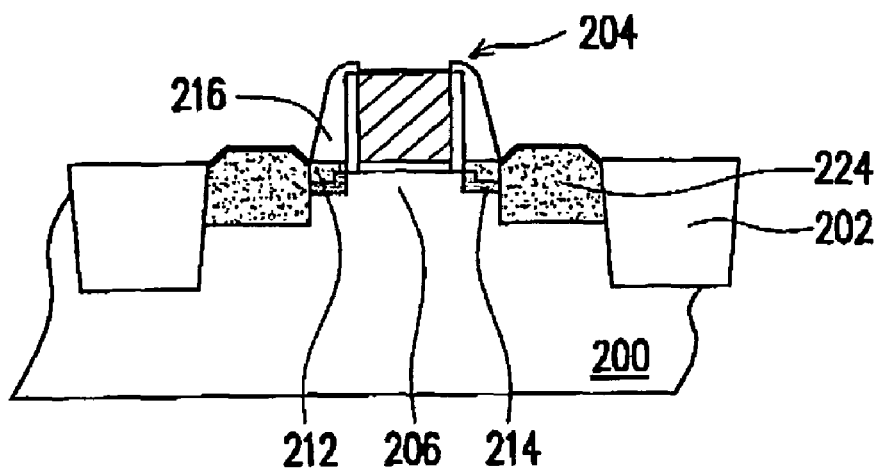
FIG. 2 is a cross-sectional view of the metal oxide semiconductor field effect transistor, according to another embodiment of the present invention.

FIG. 2 is a cross-sectional view of the metal oxide semiconductor field effect transistor, according to another embodiment of the present invention.

Referring to FIG. 2, this metal oxide semiconductor field effect transistor primarily includes a substrate 200, an isolation structure 202, a gate structure 204, a spacer 216, a source/drain extension layer 212, and a source/drain layer 224. The substrate 200, for example, is silicon-based substrate, silicon on insulator (SOI) substrate, germanium channel substrate, substrate having bulk strain, and substrate having crystallographic orientation. The gate structure 204 is disposed on the substrate 200 in between the isolation structures 202. The portion of the substrate 200 below the gate structure 204 is the channel region of the metal oxide semiconductor field effect transistor. The spacer 216 is disposed on the side wall of the gate structure 204. The source/drain extension layer 212 is disposed in the substrate 200 under the spacer 216, and the source/drain layer 224 is disposed in the substrate 200 outside of the spacer 216, and the depth of the source/drain layer 224 is larger than the depth of the source/drain extension layer 212. The source/drain extension layer 212 and the source/drain layer 224 are both strained layers. The following descriptions serve to illustrate the advantages and structure of the two strained layers.

The structure of the source/drain extension layer 212, for example, is epitaxy, and the structure of the source/drain layer 224 can also be epitaxy. Furthermore, the material of the source/drain extension layer 212, for example, is silicon germanium, and the material of the source/drain layer 224 can also be silicon germanium. Furthermore, because germanium lattice constant is larger than silicon, therefore, the adopting of silicon germanium as material by the source/drain extension layer 212 and the source/drain layer 224 is a strained layer. The source/drain extension layer 212 and the source/drain layer 224 will exert stress on the channel region 206, thus increasing the saturation-region drain current and the linear-region drain current of the transistor. Furthermore, the source/drain extension layer 212, by adopting silicon germanium as material, can allow the rate of penetration of the carrier of the interface between the source/drain extension layer 212 and the substrate 200 to be increased, thus improving the efficiency of the metal oxide semiconductor field effect transistor.

Furthermore, the source/drain extension layer 212, for example, includes P-type dopant. This P-type dopant, for example, is boron ion. The germanium composition ratio of the portion of the source/drain extension layer 212 adjacent to the substrate 200, for example, is larger than the germanium composition ratio of the portion of the source/drain extension layer 212 disposed at a farther distance to the substrate 200. The P-type dopant, for blocking the source/drain extension layer 212, because of heat is thereby diffused towards the channel region 206, or at least is controlling the quantity of P-type dopant diffused towards the channel region 206. Furthermore, the germanium composition ratio of the source/drain extension layer 212, for example, is of gradient distribution. Furthermore, the metal oxide semiconductor field effect transistor of the present invention further includes a layer of dopant diffusion barrier layer 214, disposed in between the source/drain extension layer 212 and the substrate 200. The material of the dopant diffusion barrier layer 214, for example, is silicon germanium, and the dopant diffusion barrier layer 214, for example, includes N-type dopant. Because of the set up of the dopant diffusion barrier layer 214, therefore, the P-type dopant because of heating can be further blocked or controlled, is thus diffused towards the channel region 206, or at least controlling the quantity of the P-type dopant diffused towards the channel region 206. In addition, the source/drain layer 224 can also include P-type dopant, and this P-type dopant, for example, is boron ion.

Because the source/drain extension layer and the source/drain layer of the metal oxide semiconductor field effect transistor of the present invention are of strained layers, therefore, the source/drain extension layer and the source/drain layer will exert stress towards the channel region, thereby increasing the saturation-region drain current and the linear-region drain current of the transistor. Furthermore, because the material of the source/drain extension layer and the source/drain layer are both silicon germanium, therefore, the efficiency of the metal oxide semiconductor field effect transistor can be increased. In addition, because the dopant diffusion barrier layer is setted up and the source/drain extension layer having a specified distribution method for the germanium composition ratio, therefore, the diffusion towards the channel region of the dopant under heating inside the source/drain extension layer can be blocked, or at least the quantity of the dopants diffused towards the channel region can be controlled.

Third Embodiment

FIG. 3A to FIG. 3G are a plurality of cross-sectional views illustrating the fabrication process of the metal oxide semiconductor field effect transistor according to another embodiment of the present invention.

In the third embodiment, a NMOS fabrication process is described as an example for the illustration of the metal oxide semiconductor field effect transistor of the present invention.

Figure 3A:
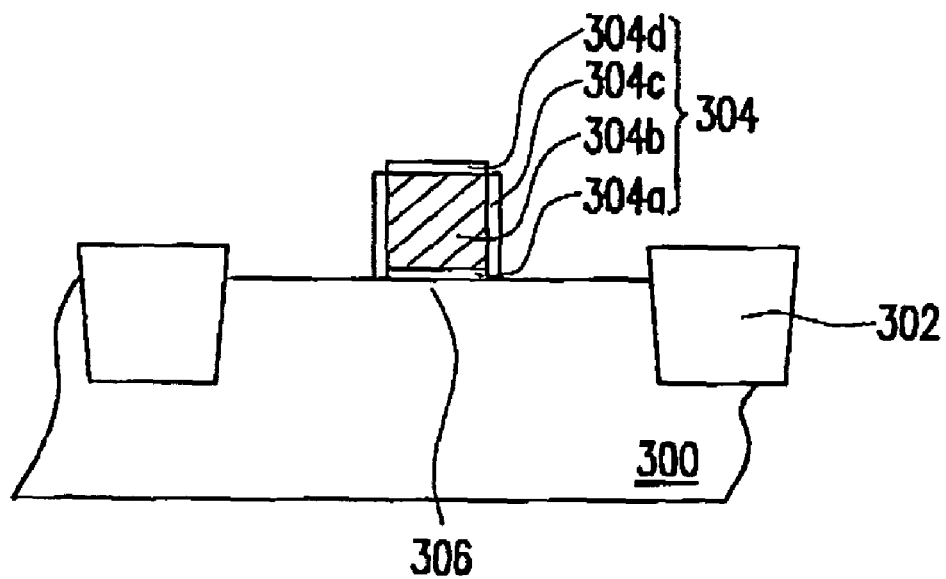
FIG. 3A to FIG. 3G are a plurality of cross-sectional views illustrating the fabrication process of the metal oxide semiconductor field effect transistor according to another embodiment of the present invention.

Referring to FIG. 3A, first a substrate 300 is provided. The substrate 300, for example, is silicon-based substrate, silicon on insulator (SOI) substrate, germanium channel substrate, substrate having bulk strain, and substrate having crystallographic orientation. A plurality of isolation structures 302 are formed on the substrate 300. The material of the isolation structure 302, for example, is silicon oxide. A gate structure 304 is formed on the substrate 300 in between the isolation structures 302. The gate structure 304 at least includes a gate dielectric layer 304a, a gate 304b, and a spacer 304c, and a gate protection layer 304d. In which, the material of the gate dielectric layer 304a, for example, is silicon oxide. The material of the gate 304b, for example, is doped polysilicon, the material of the spacer 304c, for example, is silicon oxide, and the material of the gate protection layer 304d, for example, is silicon nitride or silicon oxide. Furthermore, the substrate 300 below the gate structure 304 is to be the channel region 306 of the metal oxide semiconductor field effect transistor.

Figure 3B:
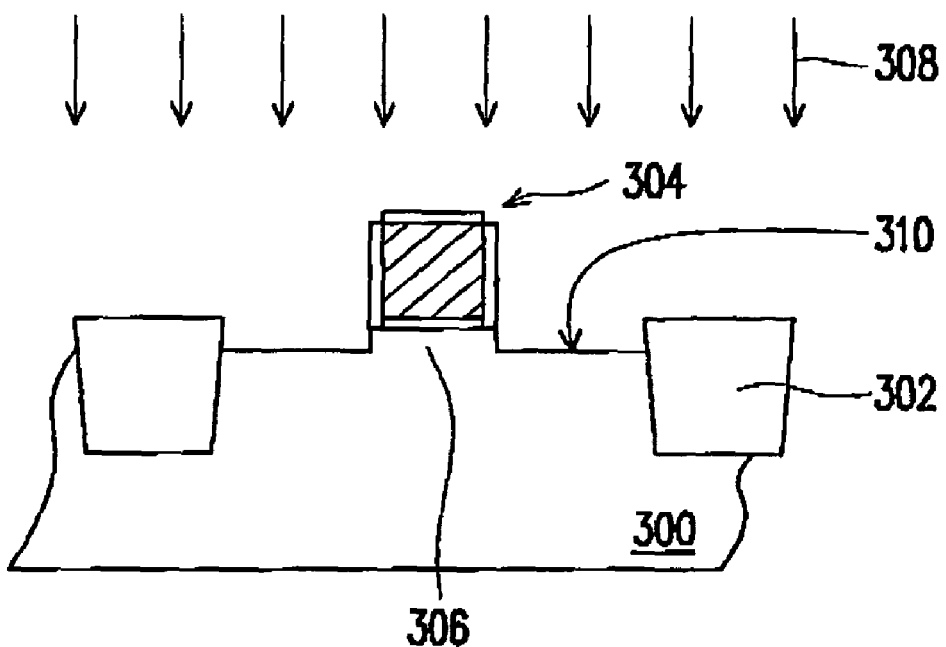

Later, referring to FIG. 3B, dry etching process 308 is performed, and a portion of the substrate 300 is removed at the the two side walls of the gate structure in the substrate 300 to form a recess 310. The dry etching process 308, for example, is reactive ion etching.

Figure 3C:
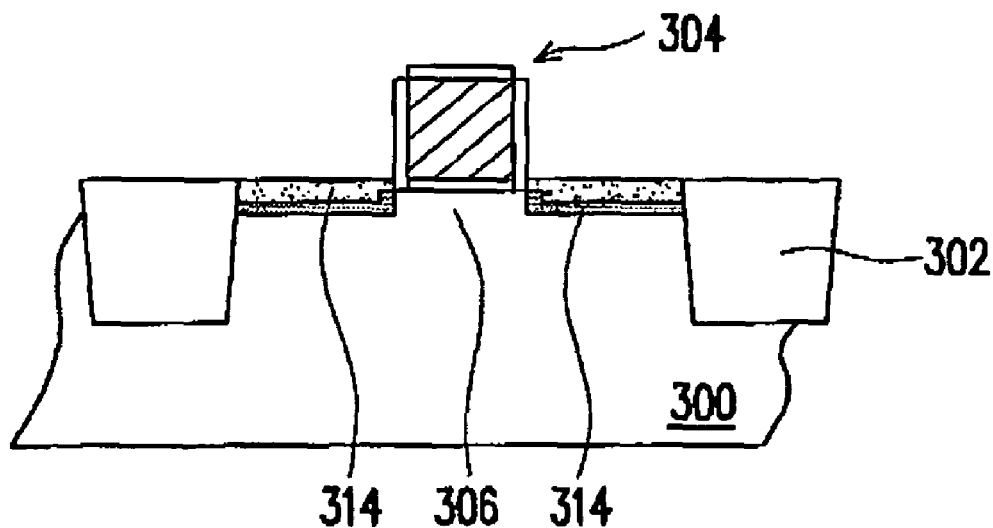

Later, referring to FIG. 3C, a source/drain extension layer 312 is formed inside the recess 310. The material of the source/drain extension layer 312 for example, is silicon carbide. The composite structure of the silicon carbide is typically represented by $Si_xC_{1-x}$, or directly represented by SiC. In which, the range for X is between 0 to 1. Furthermore, the structure of the source/drain extension layer 312, for example, is epitaxy. The method of fabrication of the source/drain extension layer 312, for example, is selective epitaxial deposition, which allows silicon carbide to only grow on the silicon, and not on the silicon oxide or the silicon nitride. In other words, silicon carbide only grows on the recess 310, and not on the spacer 304, the gate protection layer 304d, and the isolation structure 302. The selective epitaxial deposition, for example, is vapor-phase epitaxial fabrication, which includes low-pressure chemical vapor deposition expitaxial growth, atmospheric pressure CVD expitaxial growth, and ultra-high vacuum CVD epitaxial growth.

One thing worthy of mentioning is that, the lattice constant of carbon is less than silicon, therefore, the source/drain extension layer 312 which adopts silicon carbide as material is a strained layer. In other words, the silicon carbide lattice of the source/drain extension layer 312, due to stretching stress, is to produce an anisotropic structure, thereby changing the conduction band and the valence band. Because when the source/drain extension layer 312 and the substrate 300 are integrated, the conduction band and the valence band can be tailored to perform design discontinuously to produce quantum well and built-in electric field, therefore, the rate of penetration of the carrier of the interface between the source/drain extension layer 312 and the substrate 300 is allowed to be increased. In summary, the source/drain extension layer 312, by adopting silicon carbide as material, can improve the efficiency of the metal oxide semiconductor field effect transistor.

Furthermore, the source/drain extension layer 312, for example, includes N-type dopant. N-type dopant, for example, is to perform in-situ doping injection during the forming of the source/drain extension layer 312. In comparison with ex-situ, in-situ doping can allow the source/drain extension layer 312 to have higher activation doping concentration. The higher activation doping concentration can increase the saturation-region drain current and the linear-region drain current of the transistor. Of course, N-type dopant can also performing ex-situ doping injection after the forming of the source/drain extension layer 312. Furthermore, N-type dopant, for example, is boron ion or arsenic ion. One thing wothy of mentioning is that, after the forming of the source/drain extension layer 312, the procedure for doping activation annealing will typically be performed, thus allowing the diffusion of N-type dopant towards the channel region 306 below the gate structure 304. For the effective control of the rate of diffusion of N-type dopant, in the present embodiment, prior to the forming of the source/drain extension layer 312, a layer of the dopant diffusion barrier layer 314 formed inside the recess 310 is further included, but the present invention is not limited to this. The material of the dopant diffusion barrier layer 314, for example, is silicon carbide. Furthermore, the dopant diffusion barrier layer 314, for example, includes P-type dopant, for blocking excessive amount of N-type dopant diffused towards the channel region 306. The method of fabrication of the dopant diffusion barrier layer 314, for example, is the aforementioned selective epitaxial deposition. Furthermore, in another embodiment, the carbon composition ratio of the portion of the source/drain extension layer 312 adjacent to the substrate 300, for example, is larger than the carbon composition ratio of the portion of the source/drain extension layer 312 at a farther distance to the substrate 300. This type of design allows a portion of the source/drain extension layer 312 adjacent to the channel region 306 to have more carbon atoms, to block excessive amount of N-type dopant to diffuse towards the channel region 306. Furthermore, the carbon composition ratio of the source/drain extension layer 312, for example, is of gradient distribution. Thus it can be seen that, when the source/drain extension layer 312 includes N-type dopant, it is possible to utilize the carbon distribution of the source/drain extension layer 312 to control the amount of N-type dopant which is diffused towards the channel region 306.

Figure 3D:
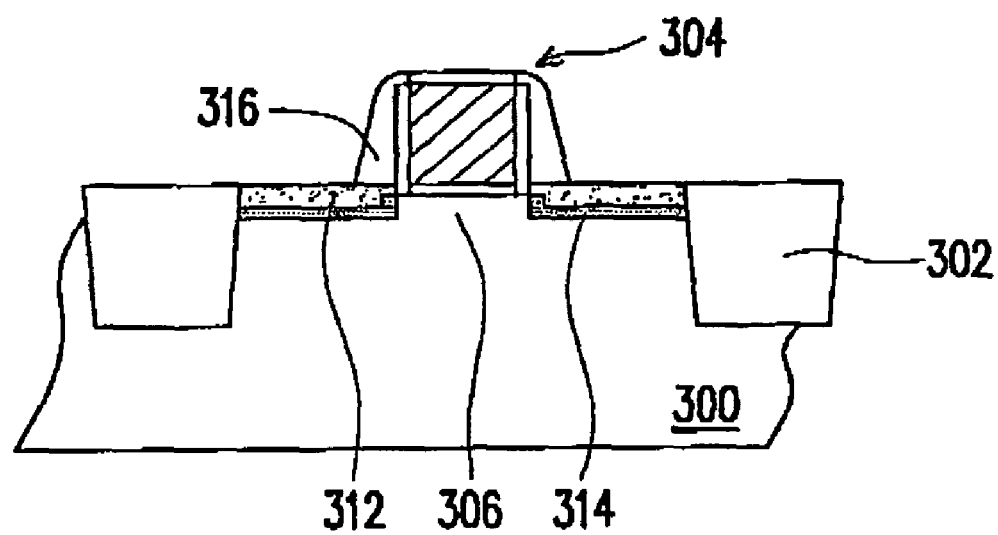

Later, referring to FIG. 3D, a spacer 316 is formed on the two side walls of the gate structure 304. The material of the spacer 316, for example, is silicon nitride, and the method of fabrication of the spacer 316 in the present invention is of a conventional technique used and known by those skilled in the art, therefore, no further details are required.

Figure 3E:
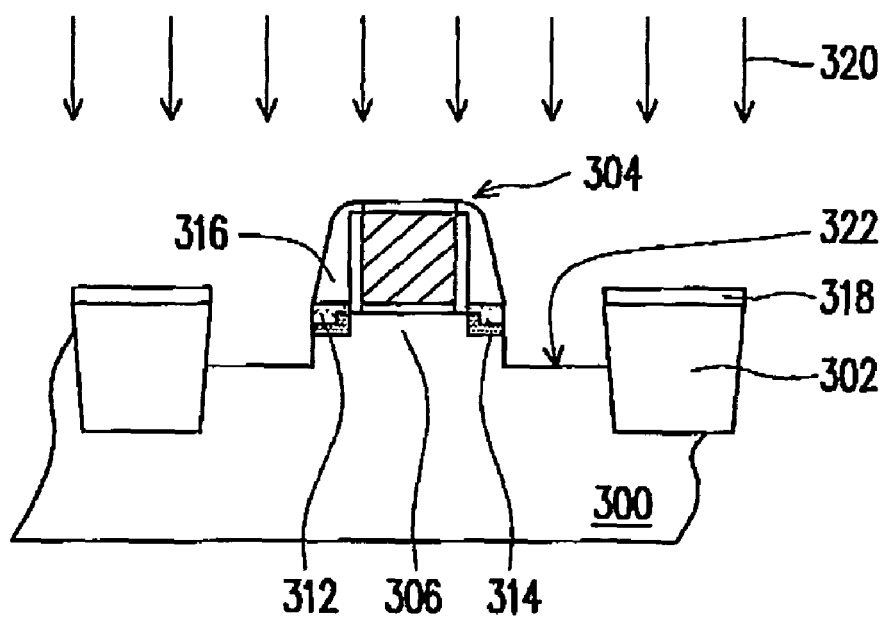

Later, referring to FIG. 3E, a layer of dielectric layer 318 is formed on the isolation structure 302. The material of the dielectric layer 318, for example, is silicon oxide or silicon nitride. The method of fabrication of the dielectric layer 318, for example, is to first form a layer of the dielectric layer over all of the structures illustrated in FIG. 3D, then to perform photolithography and etching to expose the spacer 316 and the source/drain extension layer 312, and then to forming it. Later, using the spacer 316 and the dielectric layer 318 as a mask, a dry etching process 320 is performed for removing a portion of the source/drain extension layer 312 and a portion of the substrate 300 to form a recess 322. Furthermore, because the metal oxide semiconductor field effect transistor of the present embodiment further includes the dopant diffusion barrier layer 314, therefore, the dry etching process 320 further includes the removal of a portion of the dopant diffusion barrier layer 314. In addition, the reaction gas used in the dry etching process 320 during removal of silicon carbide is, for example, $CF_4$, $C_4F_8$, and $C_5F_{10}$.

Figure 3F:
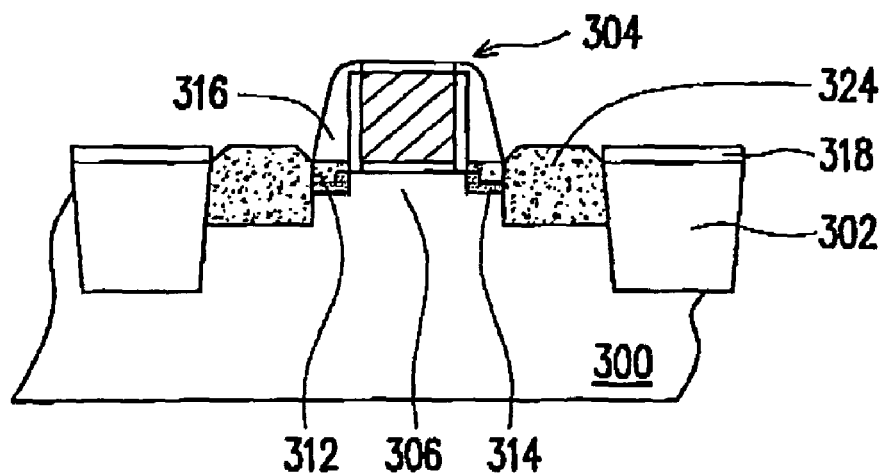

Later, referring to FIG. 3F, a source/drain layer 324 is deposited inside the recess 322. The material of the source/drain layer 324, for example, is silicon carbide, And the structure of the source/drain layer 324, for example, is epitaxy. In addition, because the material of the source/drain layer 324 is silicon carbide, therefore, the source/drain layer 324 is a strained layer, thus the efficiency of the metal oxide semiconductor field effect transistor can be improved. The method of fabrication of the source/drain layer 324, for example, is the aforementioned selective epitaxial deposition, to allow silicon carbide growth only on the silicon, and not growth on silicon oxide or silicon nitride. In other words, silicon carbide will only grow on the recess 322, and will not grow on the gate protection layer 304d, the spacer 316 and the dielectric layer 318. Furthermore, the source/drain layer 324, for example, includes N-type dopant. N-type dopant, for example, during the forming of the source/drain layer 324, is to perform in-situ doping injection. In comparison with ex-situ doping, in-situ doping can make the source/drain layer 324 to have higher activation doping concentration. The higher activation doping concentration will increase the saturation-region drain current and the linear-region drain current of the transistor. Of course, ex-situ doping injection can be performed after the forming of the source/drain layer 324. Furthermore, N-type dopant of the source/drain layer 324, for example, is phosphorous ion or arsenic ion.

Figure 3G:
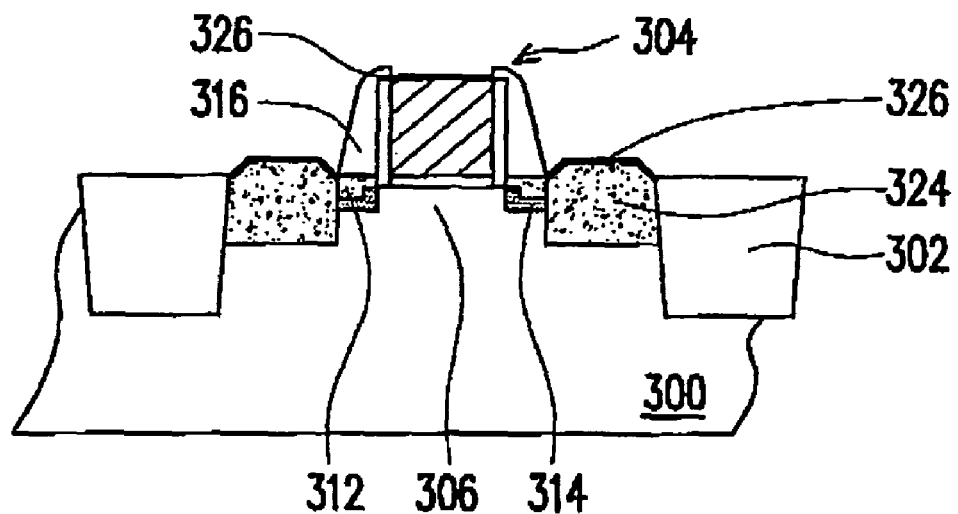

Later, referring to FIG. 3G, the dielectric layer 318 and the gate protection layer 304d is removed. The method for removal of the gate protection layer 304d and the dielectric layer 318, for example, is a wet etching process, and this wet etching process, for example, is using hot phosphoric acid or hydrofluoric acid as etchant. Later, a metal silicide layer 326 is formed on the gate 304b on the gate structure 302 and also on the source/drain layer 324, for decreasing the contact resistance between the subsequently formed contact and the source/drain layer 324, and the contact resistance between the contact and the the gate 304b. The material of the silicide layer 326, for example, is nickel silicide or other metal silicides. The method of fabrication of the metal silicide layer 326, for example, is to first deposit a layer of nickel, and then to perform a rapid thermal anneal. The material and method of fabrication of the aforementioned metal silicide layer 326 is exemplary, however, the present invention is not limited to this only. Later, subsequent procedures are performed for the completion of the fabrication of the metal oxide semiconductor field effect transistor.

Because a layer of dopant diffusion barrier layer is first formed prior to forming of the source/drain extension layer in the present invention, therefore, the N-type dopant is blocked because of activation annealing is then diffused towards the channel region after forming of the source/drain extension layer. Furthermore, because the carbon composition ratio of the portion of the source/drain extension layer adjacent to the substrate, for example, is larger than the carbon composition ratio of the portion of the source/drain extension layer at a farther distance to the substrate, therefore, N-type dopant, because of activation annealing, can have controlled rate of diffusion towards the channel region. Because the diffusion rate of the N-type dopant has obtained superior control towards the channel region, therefore, fabrication allowance is increased.

Fourth Embodiment

Figure 4:
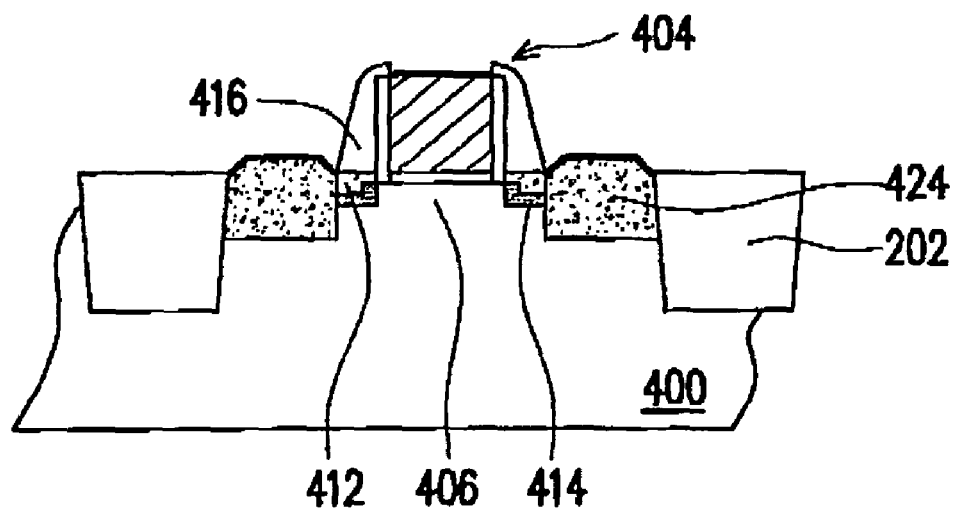
FIG. 4 is a cross-sectional view of the metal oxide semiconductor field effect transistor, according to another embodiment of the present invention.

FIG. 4 is a cross-sectional view of the metal oxide semiconductor field effect transistor, according to another embodiment of the present invention.

Referring to FIG. 4, the metal oxide semiconductor field effect transistor mainly includes a substrate 400, an isolation structure 402, a gate structure 404, a spacer 416, a source/drain extension layer 412, and a source/drain layer 424. The substrate 400, for example, is silicon-based substrate, silicon on insulator (SOI) substrate, germanium channel substrate, substrate having bulk strain, and substrate having crystallographic orientation. The gate structure 404 is disposed on the substrate 400 in between the isolation structures 402. A portion of the substrate below the gate structure 404 is the channel region 406 of the metal oxide semiconductor field effect transistor. The spacer 416 is disposed on the side wall of the gate structure 404. The source/drain extension layer 412 is disposed in the substrate 400 below the spacer 416, and the source/drain layer 424 is disposed in the substrate 400 outside of the spacer 416, and the depth of the source/drain layer 424 is larger than the depth of the source/drain extension layer 412. The source/drain extension layer 412 and the source/drain layer 424 are both strained layers. The following are the detailed description of the advantages and structure of the two strained layers:

The structure of the source/drain extension layer 412, for example, is epitaxy, and the structure of the source/drain layer 424 can also be epitaxy. Furthermore, the material of the source/drain extension layer 412, for example, is silicon carbide, and the material of the source/drain layer 424 can also be silicon carbide. Because the carbon lattice is lesser than silicon, therefore, the source/drain extension layer 412 and the source /drain layer 424, which adopt silicon carbide as material, are strained layers. The source/drain extension layer 412 and the source/drain layer 424 will apply a tensile stress towards the channel region 406. Furthermore, the source/drain extension layer 412 adopting silicon carbide as material can allow the rate of penetration of the carrier of the interface between the source/drain extension layer 412 and the substrate 400 to be increased, thus improving the efficiency of the metal oxide semiconductor field effect transistor.

Furthermore, the source/drain extension layer 412, for example, includes N-type dopant. The N-type dopant, for example, is phosphorous ion or arsenic ion. The carbon composition ratio of the portion of the source/drain extension layer 412 adjacent to the substrate 400, for example, is larger than the carbon composition ratio of the portion of the source/drain extension layer 412 at a farther distance to the substrate 400, as a result, blocking N-type dopant of the source/drain extension layer 412, which is thereby diffused towards the channel region 406 because of heat, or at least controlling the quantity of N-type dopant diffused towards the channel region 406. Furthermore, the carbon composition ratio of the source/drain extension layer 412, for example, is of gradient distribution. Furthermore, the metal oxide semiconductor field effect transistor of the present invention further includes a layer of dopant diffusion barrier layer 414, disposed in between the source/drain extension layer 412 and the substrate 400. The material of the dopant diffusion barrier layer 414, for example, is silicon carbide, and the dopant diffusion barrier layer 414, for example, includes P-type dopant. Because of the set up of the dopant diffusion barrier layer 414, therefore, the N-type dopant, because of heating, is thus diffused towards the channel region 406 and can be further blocked or controlled, or at least the quantity of the N-type dopant diffused towards the channel region 406 can be controlled. In addition, the source/drain layer 424 can also include N-type dopant, and the N-type dopant, for example, is phosphorous ion or arsenic ion.

Because the source/drain extension layer and the source/drain layer of the metal oxide semiconductor field effect transistor of the the present invention are both strained layers, and the material of the source/drain extension layer and of the source/drain layer are both silicon germanium, therefore, the efficiency of the metal oxide semiconductor field effect transistor can be increased. In addition, because of the set up of the dopant diffusion barrier layer and the source/drain extension layer having a specific distribution method for carbon composition ratio, therefore, the dopant inside of the source/drain extension layer which are diffused towards the channel region due to heating can be blocked, or at least the quantity of the dopants which are diffused towards the channel region can be controlled.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A metal oxide semiconductor field effect transistor, comprising:
   a substrate;
   a gate structure, disposed on the substrate;
   a spacer, disposed on a side wall of the gate structure;
   a source/drain extension layer, disposed in the substrate below the spacer;
   a source/drain layer, disposed in the substrate outside of the spacer, wherein the depth of the source /drain layer is larger than the depth of the source/drain extension layer, the source/drain extension layer and an entire of the source /drain layer are both strained layers, the strained layer of the source/drain extension layer comprises silicon germanium, and the germanium composition ratio of the portion of the source/drain extension layer adjacent to the substrate is larger than the germanium composition ratio of the portion of the source/drain extension layer disposed at a farther distance to the substrate; and
   a dopant diffusion barrier layer, only disposed directly under the same source/drain extension layer.

2. The metal oxide semiconductor field effect transistor in claim 1, wherein the structure of the source/drain extension layer comprises epitaxy.

3. The metal oxide semiconductor field effect transistor in claim 1, wherein the structure of the source /drain layer comprises epitaxy.

4. The metal oxide semiconductor field effect transistor in claim 1, wherein the germanium composition ratio of the source/drain extension layer is of gradient distribution.

5. The metal oxide semiconductor field effect transistor in claim 1, wherein the material of the dopant diffusion barrier layer comprises silicon germanium.

6. The metal oxide semiconductor field effect transistor in claim 5, wherein the dopant diffusion barrier layer comprises N-type dopant.

7. The metal oxide semiconductor field effect transistor in claim 1, wherein the source/drain extension layer comprises P-type dopant.

8. The metal oxide semiconductor field effect transistor in claim 7, wherein the P-type dopant comprises boron ion.

9. The metal oxide semiconductor field effect transistor in claim 1, wherein the material of the source /drain layer comprises silicon germanium.

10. The metal oxide semiconductor field effect transistor in claim 9, wherein the source /drain layer comprises P-type dopant.

11. The metal oxide semiconductor field effect transistor in claim 10, wherein the P-type dopant comprises boron ion.

12. The metal oxide semiconductor field effect transistor in claim 1, wherein the strained layer of the source /drain layer comprises silicon carbide.

13. The metal oxide semiconductor field effect transistor in claim 12, wherein the source /drain layer comprises N-type dopant.

14. The metal oxide semiconductor field effect transistor in claim 13, wherein the N-type dopant comprises phosphorous ion or arsenic ion.

15. The metal oxide semiconductor field effect transistor in claim 1, wherein the substrate is at least one of silicon-based substrate, pure silicon substrate, silicon on insulator (SOI) substrate, germanium channel substrate, substrate having bulk strain, and substrate having crystallographic orientation.

16. A metal oxide semiconductor field effect transistor, comprising:
   a substrate;
   a gate structure, disposed on the substrate;
   a spacer, disposed on a side wall of the gate structure;
   a source/drain extension layer, disposed in the substrate below the spacer;
   a source/drain layer, disposed in the substrate outside of the spacer, wherein the depth of the source /drain layer is larger than the depth of the source/drain extension layer, the source/drain extension layer and an entire of the source /drain layer are both strained layers, the strained layer of the source/drain extension layer comprises silicon carbide, and the carbon composition ratio of the portion of the source/drain extension layer adjacent to the substrate is larger than the carbon composition ratio of the portion of the source/drain extension layer at a farther distance to the substrate; and
   a dopant diffusion barrier layer, only disposed directly under the same source/drain extension layer.

17. The metal oxide semiconductor field effect transistor in claim 16, wherein the carbon composition ratio of the source/drain extension layer is of gradient distribution.

18. The metal oxide semiconductor field effect transistor in claim 16, wherein the material of the dopant diffusion barrier layer comprises silicon carbide.

19. The metal oxide semiconductor field effect transistor in claim 18, wherein the dopant diffusion barrier layer comprises P-type dopant.

20. The metal oxide semiconductor field effect transistor in claim 16, wherein the source/drain extension layer comprises N-type dopant.

21. The metal oxide semiconductor field effect transistor in claim 20, wherein the N-type dopant comprises phosphorous ion or arsenic ion.

* * * * *